US012733190B2

(12) United States Patent
Böttcher et al.

(10) Patent No.: US 12,733,190 B2
(45) Date of Patent: Sep. 8, 2026

(54) TRANSFER DEVICE FOR TRANSFERRING AN ELECTRONIC COMPONENT

(71) Applicant: NEXPERIA B.V., Nijmegen (NL)

(72) Inventors: Tim Böttcher, Hamburg (DE); Sönke Habenicht, Hamburg (DE); Romain Esteve, Nijmegen (NL)

(73) Assignee: NEXPERIA B.V., Nijmegen (NL)

( * ) Notice: Subject to any disclaimer, the term of this patent is extended or adjusted under 35 U.S.C. 154(b) by 509 days.

(21) Appl. No.: 18/332,594

(22) Filed: Jun. 9, 2023

(65) Prior Publication Data

US 2023/0402550 A1 Dec. 14, 2023

(30) Foreign Application Priority Data

Jun. 10, 2022 (EP) .................................... 22178346

(51) Int. Cl.
*H10D 8/60* (2025.01)
*H10D 8/01* (2025.01)
*H10D 62/832* (2025.01)

(52) U.S. Cl.
CPC ............... *H10D 8/60* (2025.01); *H10D 8/051* (2025.01); *H10D 62/8325* (2025.01)

(58) Field of Classification Search
None
See application file for complete search history.

(56) References Cited

U.S. PATENT DOCUMENTS

2006/0220166 A1* 10/2006 Kikuchi .................. H10D 8/60 257/481
2012/0056197 A1* 3/2012 Mizukami ................ H10D 8/60 257/77
2016/0276442 A1* 9/2016 Oota ................... H01L 21/0485
2021/0305435 A1* 9/2021 Hori ..................... H10D 62/126
2021/0328077 A1* 10/2021 Yu .......................... H10D 64/64

* cited by examiner

*Primary Examiner* — Xiaoming Liu
(74) *Attorney, Agent, or Firm* — Ruggiero McAllister & McMahon LLC

(57) ABSTRACT

A vertical semiconductor component including: a substrate; an epitaxial layer doped with a first conductivity type, preferably n-doped, provided on the substrate; a metal layer deposited on the epitaxial layer to form a Schottky contact with the epitaxial layer; a plurality of first regions embedded in the epitaxial layer and contacting the metal layer, and doped with a second conductivity type, in order to form a plurality of pn-junctions with the epitaxial layer; and a plurality of second regions embedded in a first region and contacting the metal layer, and doped with a second conductivity type, at a higher concentration, in order to form a plurality of low-resistance ohmic contacts with the metal layer. The semiconductor component includes a lateral cross section along which there are more first regions than second regions.

18 Claims, 12 Drawing Sheets

TRANSFER DEVICE FOR TRANSFERRING AN ELECTRONIC COMPONENT

CROSS-REFERENCE TO RELATED APPLICATIONS

This application claims the benefit under 35 U.S.C. § 119(a) of European Application No. 22178346.7 filed Jun. 10, 2022, the contents of which are incorporated by reference herein in their entirety.

BACKGROUND

1. Field of the Disclosure

The present disclosure generally relates to semiconductor components. Particular embodiments relate to a vertical semiconductor component, a mask layout for producing a vertical semiconductor component, a method of manufacturing a vertical semiconductor component, and use of a vertical semiconductor component as a rectifier.

2. Description of the Related Art

Merged PiN Schottky (MPS) diodes consisting of interdigitated Schottky and p+ implanted areas are known. As an example, the following excerpt describes a representative prior art MPS diode based on SiC:

For on-state voltage drops less than 3V, only the Schottky regions of the diode conduct and thus the device is also referred to as a Junction Barrier Schottky (JBS) diode. The on-state voltage drop of the MPS diode is determined by the resistance of the drift region, the metal-SiC barrier height, and the relative area of the Schottky vs. the p+ implanted regions. For reverse bias conditions, the depletion regions from adjacent p+ implanted regions pinch-off the leakage current arising from the Schottky contacts of the device. The leakage current in the Schottky regions occurs due to the Schottky barrier lowering at the metal-n− junction. The presence of the adjacent p+ implanted regions reduces the electric field at the metal-SiC junction because of two-dimensional charge sharing. This property is especially useful when the diode is operating at elevated temperatures since the effect of Schottky barrier lowering is enhanced with increasing temperature. The design primarily consists of selecting the optimum Schottky metal, size and spacing of the p+ implanted regions, and thickness and dopant density of the drift region. It is important to achieve a good quality Schottky interface to obtain a low on-state drop when operated in the JBS diode mode. The metal-SiC barrier height of the Schottky metal should be low enough to give a low on-state voltage, while still enabling effective pinch-off during the off state. This is achieved using Ni as the Schottky metal. (Tesfaye Ayalew, "SiC Semiconductor Devices Technology, Modeling, and Simulation", Vienna, 2004)

The leakage current of Schottky diodes in SiC (and in other semiconductors) can be reduced by adding a narrow grid of pn-junctions to the active area. Such a grid reduces the electric field at the Schottky contact in the case of reverse bias. The devices are called Junction Barrier Schottky (JBS) diodes.

When these pn-junctions are contacted to the top metal they will reduce the forward resistance for high current densities. At high current densities the pn− junctions will be driven in forward mode and will inject minority carries into the bulk. These minority carriers modulate the carrier density thus decreasing the on-resistance.

The optimum distance for the field relief structures is smaller than the optimum distance for the pn-injectors. Furthermore, the pn-injectors have a larger width than the field relief structures, because the ohmic contact area must be fitted into the diffusion area with a specific overlap.

US 2017/271528 A1 discloses a semiconductor device having multiple p stripe channels 28/22 embedded in an n− drift region 20, and within some 22 of the p stripe channels are embedded p+ islands 24. See FIGS. 1-2.

US 2020/091298 A1 discloses a semiconductor device with p stripes 28 embedded in an n− drift region 22, wherein multiple p stripes 28 are connected via a p anode region 24 in which is embedded a metal silicide layer 18. See FIGS. 1-3.

SUMMARY

If both functionalities are needed (lower leakage in reverse and lower resistance in forward) then the remaining Schottky area is reduced when compared to either the field-relief only or compared to the pn-injectors only.

Therefore, a problem with prior art MPS diodes is that the field relief structures are wide (to implement ohmic contacts) but are also close together (to improve current leakage in reverse operation, i.e. to achieve an improved field effect), which limits the remaining available Schottky area.

It is an aim of at least some embodiments according to the present disclosure to improve the available Schottky area, whilst balancing current leakage.

Accordingly, there is provided in a first aspect of the present disclosure a vertical semiconductor component according to independent claim 1. The vertical semiconductor component (or further for brevity "the semiconductor component") comprises a substrate and an epitaxial layer doped with a first conductivity type, preferably n-doped, which is provided on the substrate. The semiconductor component further comprises a metal layer deposited on the epitaxial layer to form a Schottky contact with the epitaxial layer. The semiconductor component further comprises a plurality of first regions embedded in the epitaxial layer and contacting the metal layer. The plurality of first regions is doped with a second conductivity type, preferably p-doped, at a first concentration. In this way, the plurality of first regions forms a plurality of pn-junctions with the epitaxial layer. The semiconductor component further comprises a plurality of second regions. Each second region is embedded in a first region of the plurality of first regions and contacts the metal layer. The plurality of second regions is doped with a second conductivity type, preferably p-doped, at a second concentration higher than the first concentration. In this way, the plurality of second regions forms a plurality of low-resistance ohmic contacts with the metal layer. The semiconductor component also comprises a cross section in a lateral direction of the vertical semiconductor component, along which cross section the number of first regions of the plurality of first regions is greater than the number of second regions of the plurality of second regions. Furthermore, the plurality of first regions comprises elongated sections, forming a narrower part of a first region, and eye-shaped sections, forming a wider part of a first region; and in that the elongated sections of the first regions optionally comprise interruptions, such that each separate first region has one corresponding second region embedded therein, in an eye-shaped section of that first region.

Embodiments according to the present disclosure are based on the insight of the inventors to provide a vertical semiconductor component with a cross section in a lateral direction of the vertical semiconductor component, along which cross section the number of first regions of the plurality of first regions is greater than the number of second regions of the plurality of second regions. In other words, a lateral cross section of the lateral semiconductor product can be established along which there are more first regions than second regions. An effect of this feature is that there are some first regions without corresponding second regions. Thus, there are more first regions and the first regions are therefore, at least on average, closer together than the second regions (embedded in first regions). This allows the semiconductor component to use a first suitable average distance between the first regions, for the field relief effect that reduces the leakage current (i.e. a JBS function), and to use a second suitable average distance between the second regions, for improvement of the forward bias behavior by carrier injection (i.e. an MPS function). Consequently, embodiments according to the present disclosure may offer lower leakage in reverse and lower resistance in forward, whilst striving to increase the available Schottky area.

The area of the remaining Schottky contact is therefore larger than for the above-described known MPS diodes.

It is preferred to not embed the second regions directly in the epitaxial layer, i.e. without being surrounded by a first region separating the second region from the epitaxial layer, i.e. betwixt two separate first regions, in order to prevent breakdown/leakage.

In some embodiments, the plurality of second regions is embedded in at most a subset of the plurality of first regions. In other words, there are some first regions without a second region embedded therein.

In some embodiments, at least two second regions of the plurality of second regions are connected via a section of a first region of the plurality of first regions. In other words, some first regions may have embedded in them two or more second regions.

In some embodiments, neighboring pairs of second regions of the plurality of second regions are at a greater distance from each other than a distance between neighboring pairs of first regions of the plurality of first regions.

In some embodiments, neighboring pairs of second regions of the plurality of second regions are at approximately two times a distance from each other compared to a distance between neighboring pairs of first regions of the plurality of first regions. Whilst other distances are of course possible within the scope of other embodiments, it is currently believed that a distance between second regions of approximately twice the distance between first regions is advantageous to balance the effects. In this context, the term "approximately two times" may be taken to mean any value in the range 1.5 to 2.5, preferably 1.75 to 2.25, more preferably 1.90 to 2.10. It is further noted that some of the distances between corresponding regions (i.e. distances between first regions on the one hand and/or distances between second regions on the other hand) may be different, e.g. a particular first region may be more distant from its neighboring first region on one side than from its neighboring first region on the other side, or likewise for second regions, although a uniform distance between corresponding regions is currently preferred for ease of manufacturing and more homogeneous reduction of barrier lowering. In case such different distances are used, the relationship of approximately two times the distance may e.g. be determined via averaging of those different distances.

In some embodiments, the metal layer comprises a first type of metal contacting the epitaxial layer and the first regions and a second type of metal contacting the second regions and optionally some of the first regions. In other words, the metal layer may have a different metal composition than the base Schottky metal in regions where it is in contact with the second regions, in order to improve contact with low resistivity.

In some embodiments, the plurality of second regions is embedded in at most a partial section of the plurality of first regions. In other words, there are sections of first regions in which no second region is embedded. In this manner, the first regions may operate more efficiently in terms of injecting minority charge carriers.

In this context, a partial section refers to a part of a section. Therefore, if a second region is embedded in at most a partial section of a first region, this means that a finite line can be drawn along a length axis and/or along a width axis of the first region, the finite line enclosing the length and/or the width of the first region, and that the second region embedded in that first region extends along at most a part of that finite line. This can for example be compared to an open beverage container, like a glass or a cup, and a beverage contained in that container (in this comparison having an upper surface that is flush with an upper rim of the container), in the sense that the beverage is embedded in at most a partial section of the container, since the containers walls extend beyond the beverage's length and width.

In some embodiments, the plurality of first regions, the plurality of second regions or both the plurality of first regions and the plurality of second regions is arranged in a grid formation. Such a regular formation is advantageous for ease of manufacturing.

In some embodiments, neighboring pairs of first regions of the plurality of first regions are at regular distances from each other and neighboring pairs of second regions of the plurality of second regions are at regular distances from each other. Using regular distances is advantageous for ease of manufacturing, homogeneous reduction of barrier lowering and homogeneous minority carrier injection.

In some embodiments, the substrate and the metal layer have plate shapes. In this way, the areas of contact are improved.

In some embodiments, the semiconductor component is configured to operate as a Schottky diode.

In some embodiments, at least one first region of the plurality of first regions and/or at least one second region of the plurality of second regions comprises an integral strip of material deposited in a serpentine pattern.

Also, there is provided in a second aspect of the present disclosure a mask layout for producing a vertical semiconductor component according to any above-described embodiment.

The skilled person will understand that features and considerations applying to embodiments of the vertical semiconductor component according to the present disclosure may also apply, mutatis mutandis, to embodiments of the mask layout according to the present disclosure.

Also, there is provided in a third aspect of the present disclosure a method of manufacturing a vertical semiconductor component according to independent claim 13. The method comprises the following steps. Providing a substrate. Providing an epitaxial layer doped with a first conductivity type, preferably n-doped, on the substrate. Embedding a plurality of first regions in the epitaxial layer, the plurality of first regions arranged to contact a metal layer on the epitaxial layer, the plurality of first regions doped with a second conductivity type, preferably p-doped, at a first concentration, in order to form a plurality of pn-junctions with the epitaxial layer. Embedding each of a plurality of second regions in a first region of the plurality of first regions, the plurality of second regions arranged to contact the metal layer, the plurality of second regions doped with a second conductivity type, preferably p-doped, at a second concentration higher than the first concentration, in order to form a plurality of low-resistance ohmic contacts with the metal layer. Depositing the metal layer on the epitaxial layer to form a Schottky contact with the epitaxial layer and to form low-resistance ohmic contacts with the first and the second regions. The aforementioned steps are performed in such a manner that the semiconductor component comprises a cross section in a lateral direction of the vertical semiconductor component, along which cross section the number of first regions of the plurality of first regions is greater than the number of second regions of the plurality of second regions. The aforementioned steps are also performed in such a manner that the plurality of first regions comprises elongated sections, forming a narrower part of a first region, and eye-shaped sections, forming a wider part of a first region; and in that the elongated sections of the first regions optionally comprise interruptions, such that each separate first region has one corresponding second region embedded therein, in an eye-shaped section of that first region.

The skilled person will understand that features and considerations applying to embodiments of the vertical semiconductor component according to the present disclosure may also apply, mutatis mutandis, to embodiments of the method according to the present disclosure.

In particular, any features attributed herein to embodiments of the vertical semiconductor component according to the present disclosure may also be included as steps in corresponding embodiments of the method according to the present disclosure, mutatis mutandis.

In a particular embodiment, the metal layer comprises a first type of metal contacting the epitaxial layer and the first regions and a second type of metal contacting the second regions and optionally some of the first regions. In other words, the metal layer may have a different metal composition than the base Schottky metal in regions where it is in contact with the second regions, in order to improve contact with low resistivity.

Also, there is provided in a fourth aspect of the present disclosure a use of a vertical semiconductor component according to any one of the above-described embodiments as a rectifier.

A particular advantage of using the vertical semiconductor component in this manner is to reduce die size.

The skilled person will understand that features and considerations applying to embodiments of the vertical semiconductor component according to the present disclosure may also apply, mutatis mutandis, to embodiments of the use according to the present disclosure.

BRIEF DESCRIPTION OF DRAWINGS

The disclosure will be more fully understood with the help of the following description, which is given by way of example only, and with reference to the appended drawings, in which.

Figure 5:
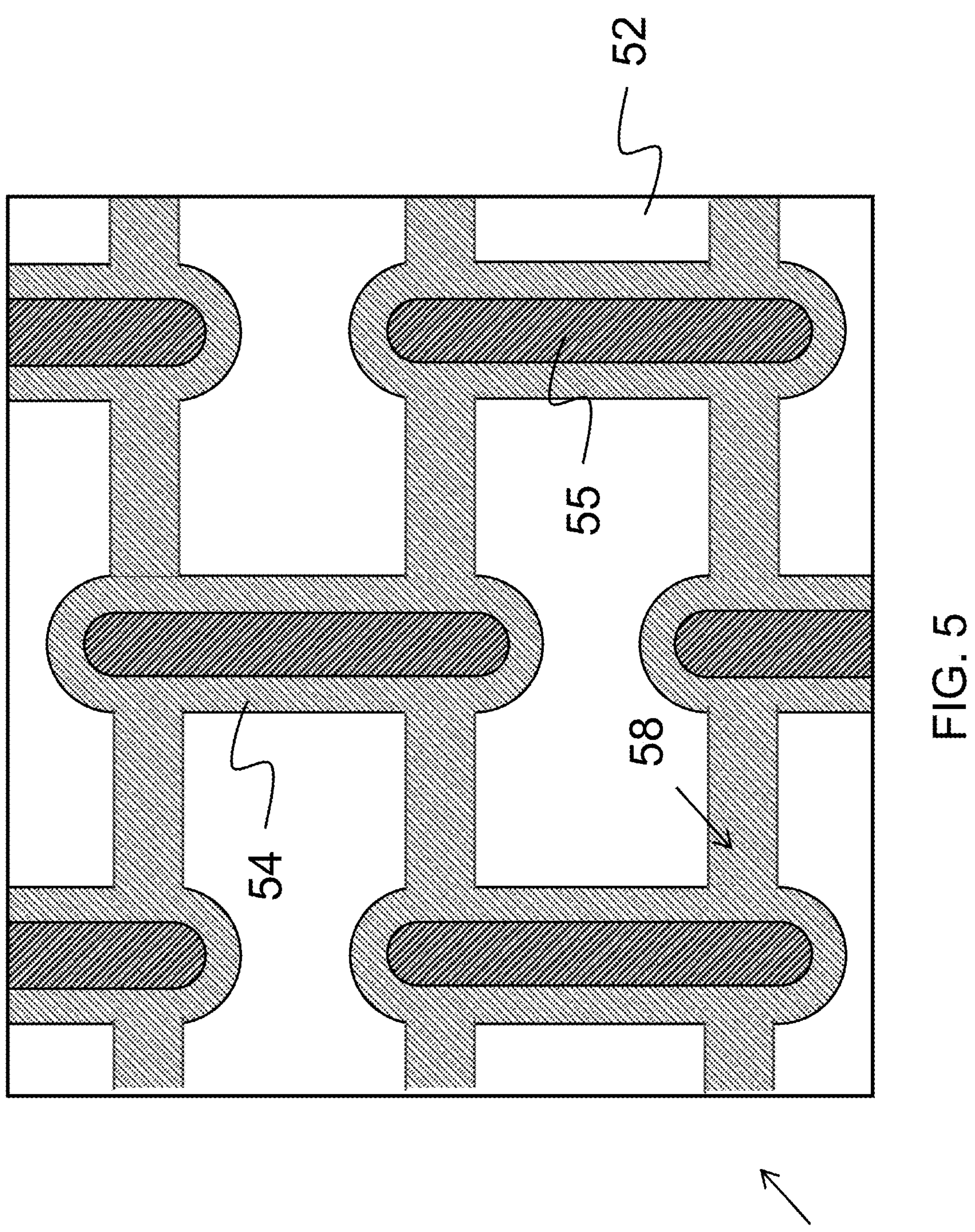
FIG. 5 schematically represents a top plan view of a first additional example of the vertical semiconductor component.
Figure 7:
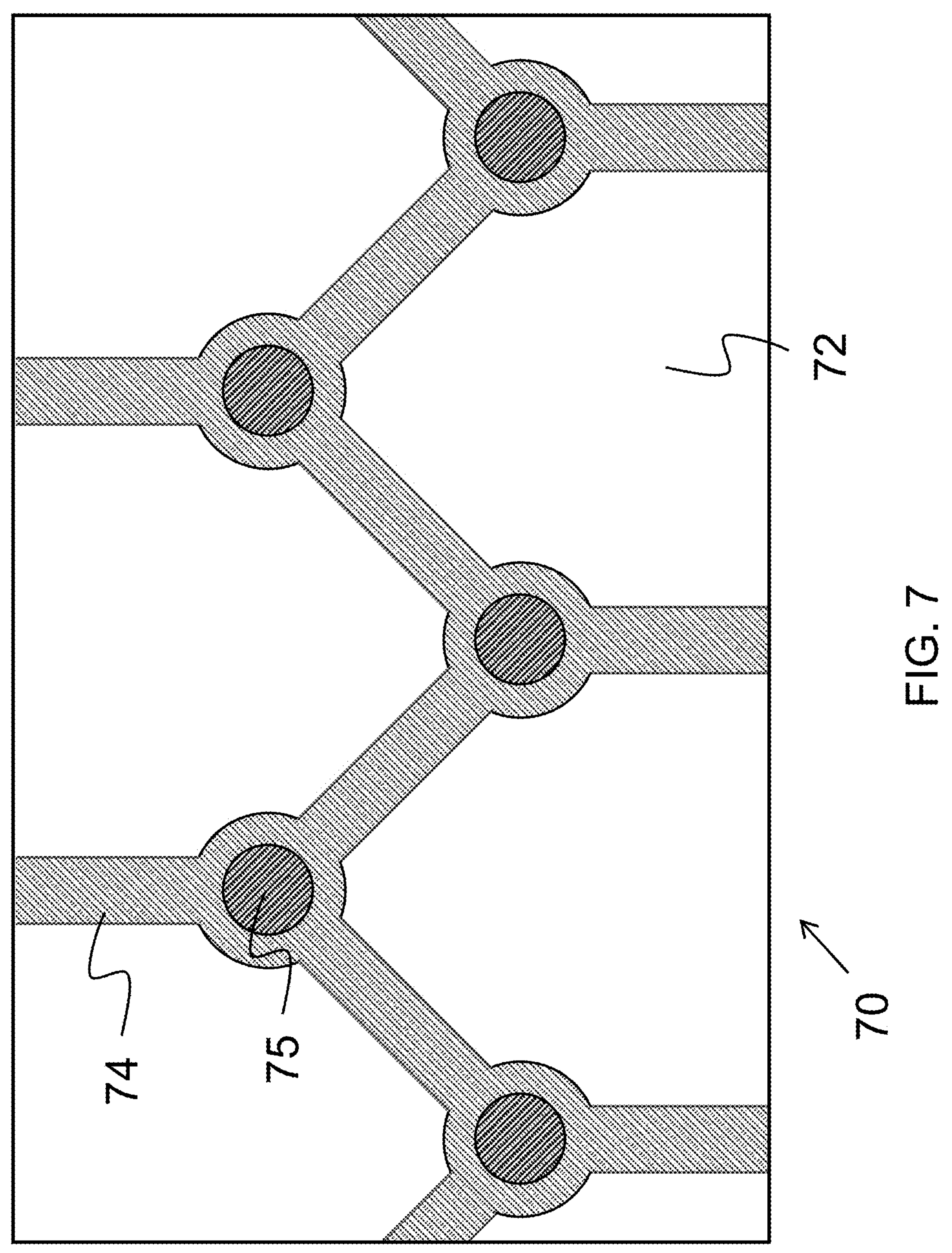
FIG. 7 schematically represents a top plan view of a second additional example of the vertical semiconductor component.

In the drawings, embodiments are illustrated by way of example. It is to be expressly understood that the description and drawings are only for the purpose of illustration and as an aid to understanding and are not intended as a definition of the limits of the disclosure. It is in particular noted that the examples shown in FIGS. 5 and 7 are not according to the present disclosure and are present for illustration purposes only. In the figures, like elements may be referred to using like reference numbers.

It will be understood that the exemplary embodiments illustrated in the drawings are schematical and therefore represent only small sized sections of the entire vertical semiconductor component.

DETAILED DESCRIPTION

Figure 1:
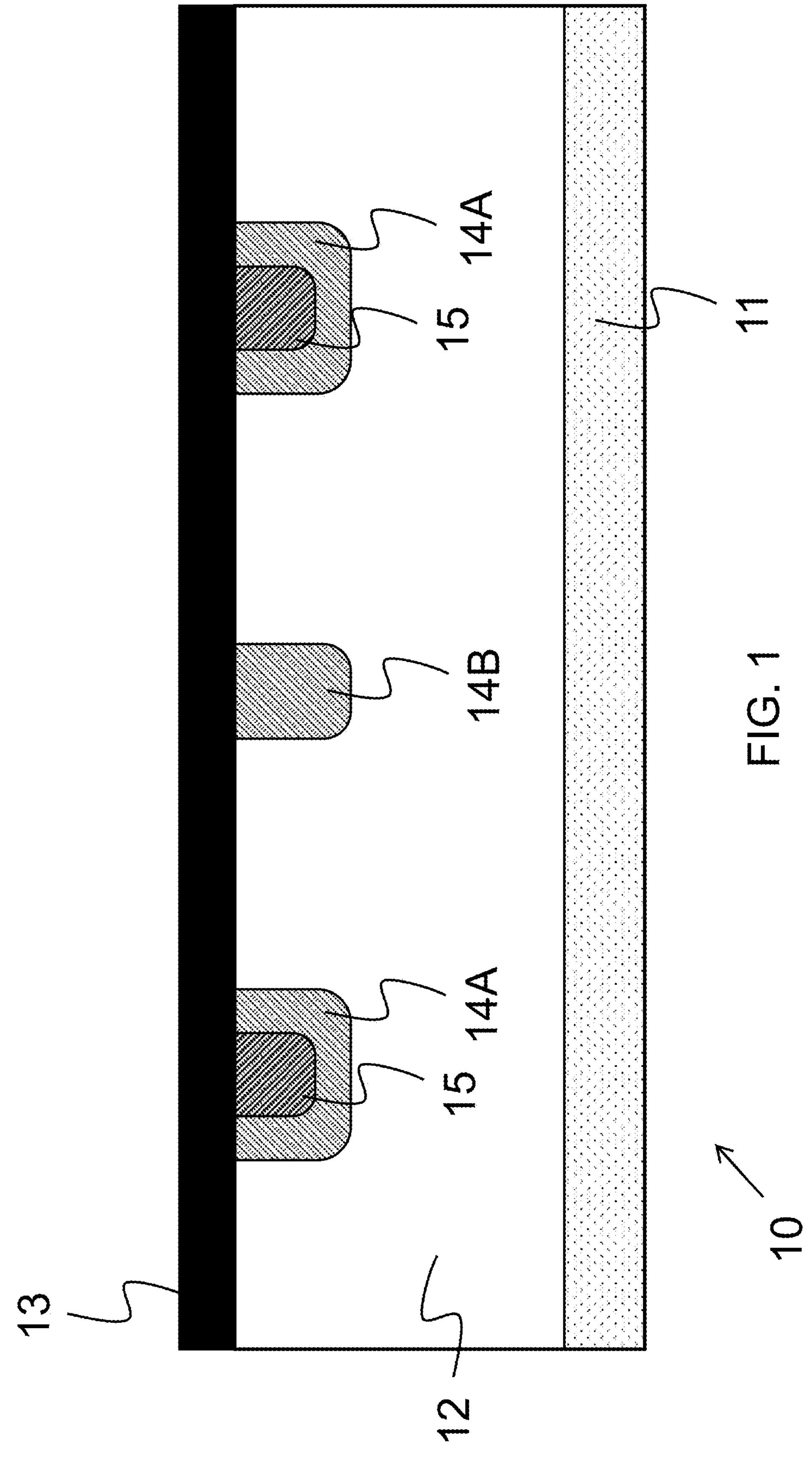
FIG. 1 schematically represents a lateral cross section view of a first embodiment of the vertical semiconductor component according to the present disclosure.

FIG. 1 schematically represents a lateral cross section view of a first embodiment 10 of the vertical semiconductor component according to the present disclosure. The figure shows that the vertical semiconductor component 10 comprises a substrate 11, an epitaxial layer 12, a metal layer 13, a plurality of first regions 14A, 14B and a plurality of second regions 15. The substrate 11 may for example be a robust SiC carrier having low resistance. The epitaxial layer 12 is doped with a first conductivity type, preferably n-doped, and is provided on the substrate 11. The epitaxial layer 12 may for example be low-doped to have a high resistivity, and thus to have minimum thickness for carrying voltage. The metal layer 13 is deposited on the epitaxial layer 12 to form a Schottky contact with the epitaxial layer 12. The plurality of first regions 14A, 14B is embedded in the epitaxial layer 12 and contacts the metal layer 13. The plurality of first regions 14A, 14B is doped with a second conductivity type, preferably p-doped, at a first concentration, in order to form a plurality of pn-junctions with the epitaxial layer 12. Each second region 15 of the plurality of second regions is embedded in a first region 14A of the plurality of first regions 14A, 14B and contacts the metal layer 13. The plurality of second regions 15 is doped with a second conductivity type, preferably p-doped, at a second concentration higher than the first concentration, in order to form a plurality of low-resistance ohmic contacts with the metal layer 13. The semiconductor component 10 comprises a cross section in a lateral direction (the plane of the drawing) of the vertical semiconductor component 10, along which cross section the number of first regions 14A, 14B of the plurality of first regions 14A, 14B is greater than the number of second regions 15 of the plurality of second regions 15. In other words, when counting the number of regions one encounters along the cross section, there will be more first regions 14A, 14B than second regions 15. Since the second regions 15 are embedded in first regions 14A, there will exist some first regions 14B in which no second region is embedded.

In other words, the first regions 14A, 14B (preferably p−) help to decrease current leakage in reverse operation, by reducing the electric field. That is, they help to provide field relief. It is preferred to arrange the first regions at a smaller distance from each other. The individual sizes of individual first regions may differ—for example, first regions having embedded therein a second region may be wider than first regions not having embedded therein a second region. The first regions 14A, 14B in other words may provide a narrower contact area at a smaller mutual distance, without high ohmic contact.

On the other hand, the second regions 15 (preferably p+) help in forward conduction at very high or surge currents to reduce current resistance in forward operation, at high current density, wherein minority carriers are injected into the epitaxial layer. The second region 15 embedded in a first region 14A may be considered to form an ohmic contact area whereas the first region 14A may be considered to form a well acting as a diffusion area. It is preferred to arrange the second regions 15 at a greater distance from each other. The second regions 15 in other words may provide a wider contact area, and thus a low ohmic contact.

Of course, where the epitaxial layer 12 and the metal layer 13 are in contact with each other, Schottky area remains available. Space is saved because there exist some first regions 14B in which no second region is embedded.

An additional advantage of having the first and second regions in contact with each other is that they will also inject minority carriers when the component is in the forward mode, at least those parts that are not too far away from the contact area. This helps to manage high current situations, by modulating how current is carried.

Figure 2:
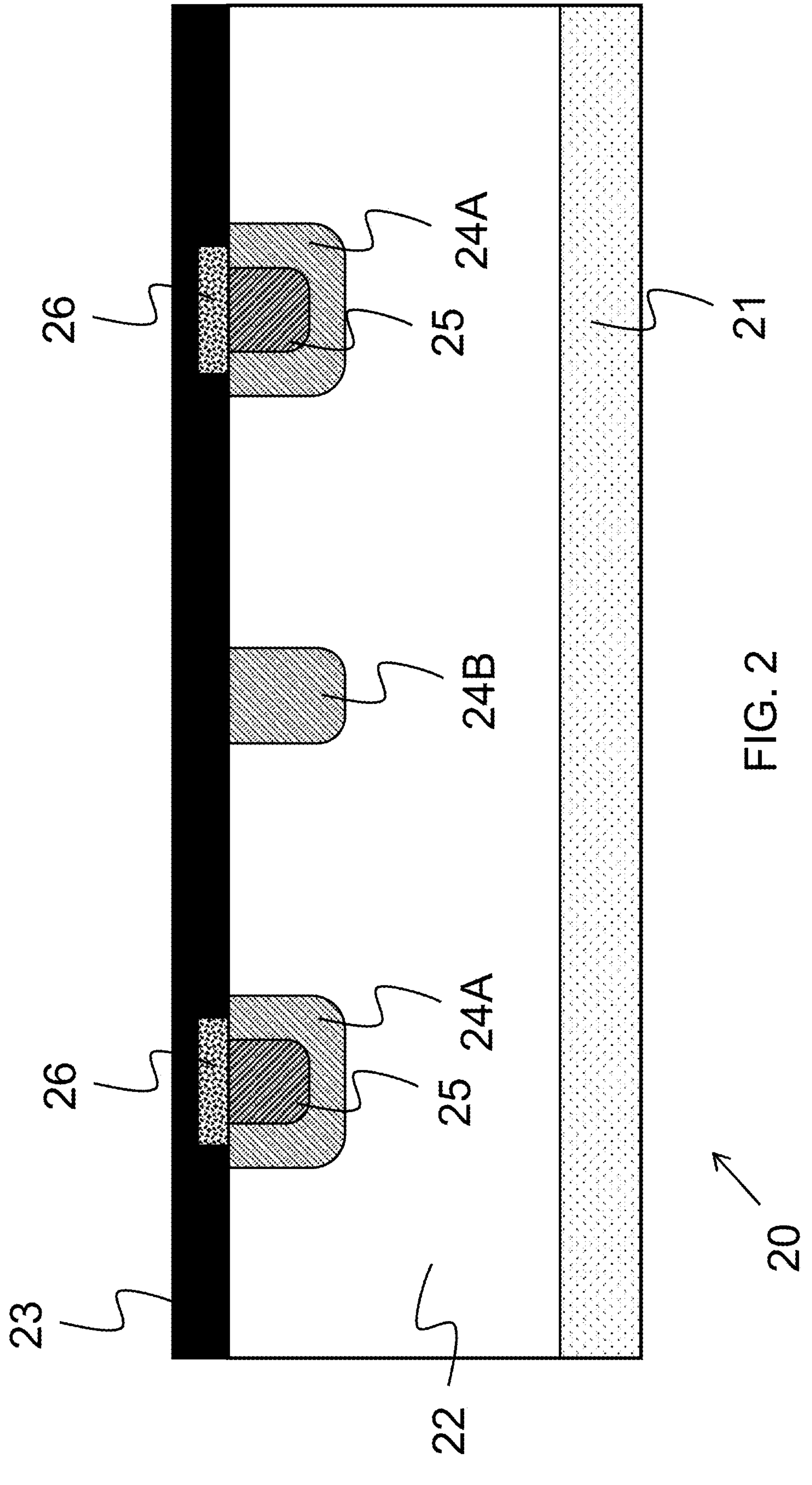
FIG. 2 schematically represents a lateral cross section view of a second embodiment of the vertical semiconductor component according to the present disclosure.

FIG. 2 schematically represents a lateral cross section view of a second embodiment 20 of the vertical semiconductor component according to the present disclosure. This second embodiment 20 is similar to the first embodiment 10 of FIG. 1, except in that the metal layer 23 comprises a first type of metal contacting the epitaxial layer 22 and the first regions 24A, 24B and a second type of metal 26 contacting the second regions 25 and some of the first regions, namely the first regions 24A into which a second region 25 is embedded. In other words, the metal layer 23 may have a different metal composition than the base Schottky metal in regions where it is in contact with the second regions 25, in order to improve contact with low resistivity.

Figure 3:
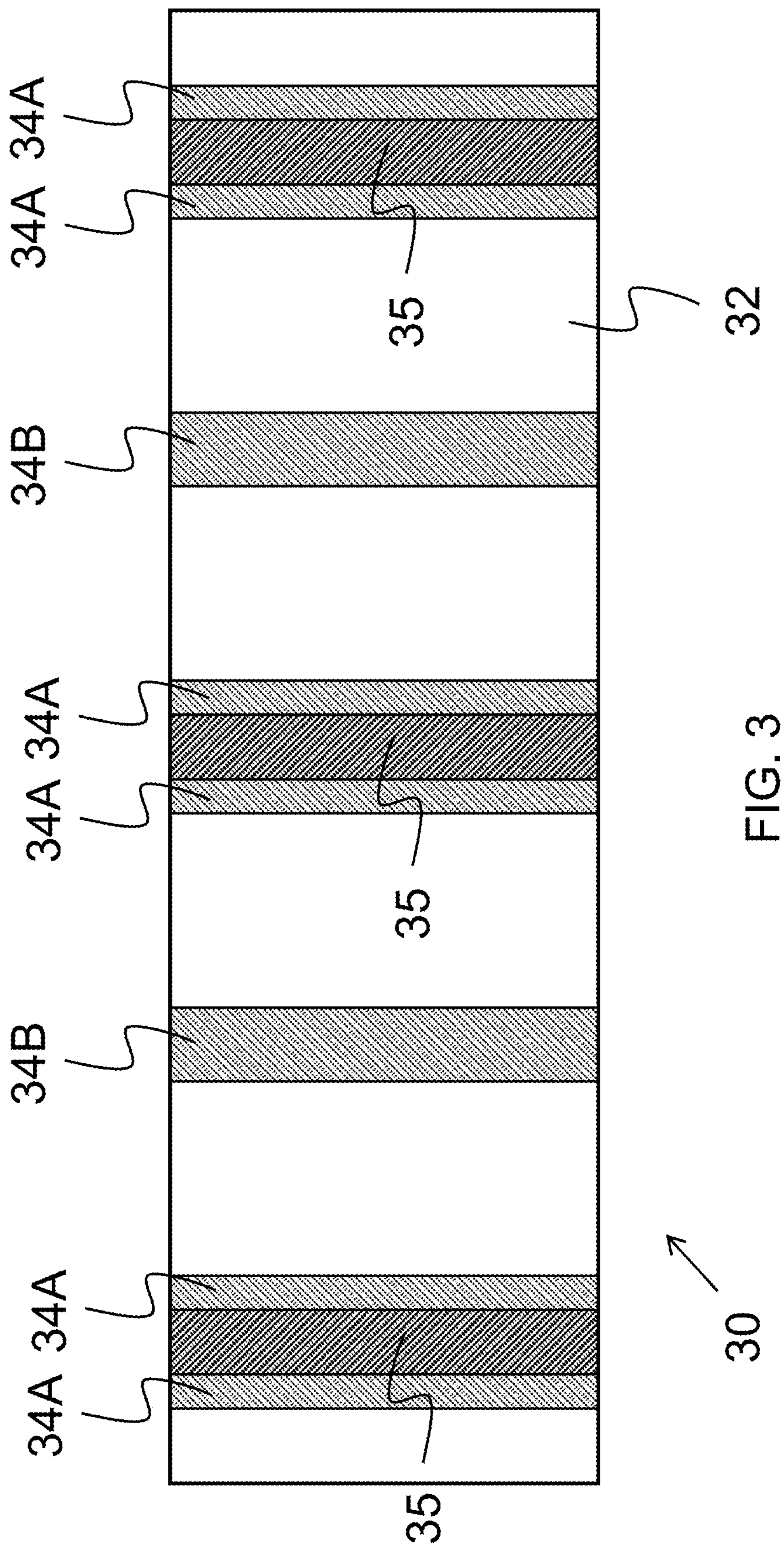
FIG. 3 schematically represents a top plan view of a third embodiment of the vertical semiconductor component according to the present disclosure.

FIG. 3 schematically represents a top plan view of a third embodiment 30 of the vertical semiconductor component according to the present disclosure. This third embodiment 30 may correspond to the first embodiment 10 shown in FIG. 1, or to the second embodiment 20 shown in FIG. 2, or may be a different embodiment from those two. The figure shows that the vertical semiconductor component 30 comprises an epitaxial layer 32 doped with a first conductivity type, preferably n− doped, and a plurality of first regions 34A, 34B and a plurality of second regions 35. This third embodiment 30 further comprises a substrate and a metal layer, which are both not shown (they would respectively lie below and above the plane of the drawing, or vice versa). The plurality of first regions 34A, 34B is embedded in the epitaxial layer 32 and contacts the metal layer. The plurality of first regions 34A, 34B is doped with a second conductivity type, preferably p-doped, at a first concentration, in order to form a plurality of pn-junctions with the epitaxial layer 12. Each second region 35 of the plurality of second regions 35 is embedded in a first region 34A of the plurality of first regions 34A, 34B and contacts the metal layer. The plurality of second regions 35 is doped with a second conductivity type, preferably p-doped, at a second concentration higher than the first concentration, in order to form a plurality of low-resistance ohmic contacts with the metal layer. The semiconductor component 30 comprises a cross section in a lateral direction (thus perpendicular to the plane of the drawing and going essentially from left to right or vice versa) of the vertical semiconductor component 30, along which cross section the number of first regions 34A, 34B of the plurality of first regions 34A, 13B is greater than the number of second regions 35 of the plurality of second regions 35.

Whilst the third embodiment 30 is conceptually easy to understand and is easy to manufacture, it has been found that alternative layouts may provide even further improved effects. Examples of such alternative layouts are presented below with reference to FIGS. 4-7.

Figure 4:
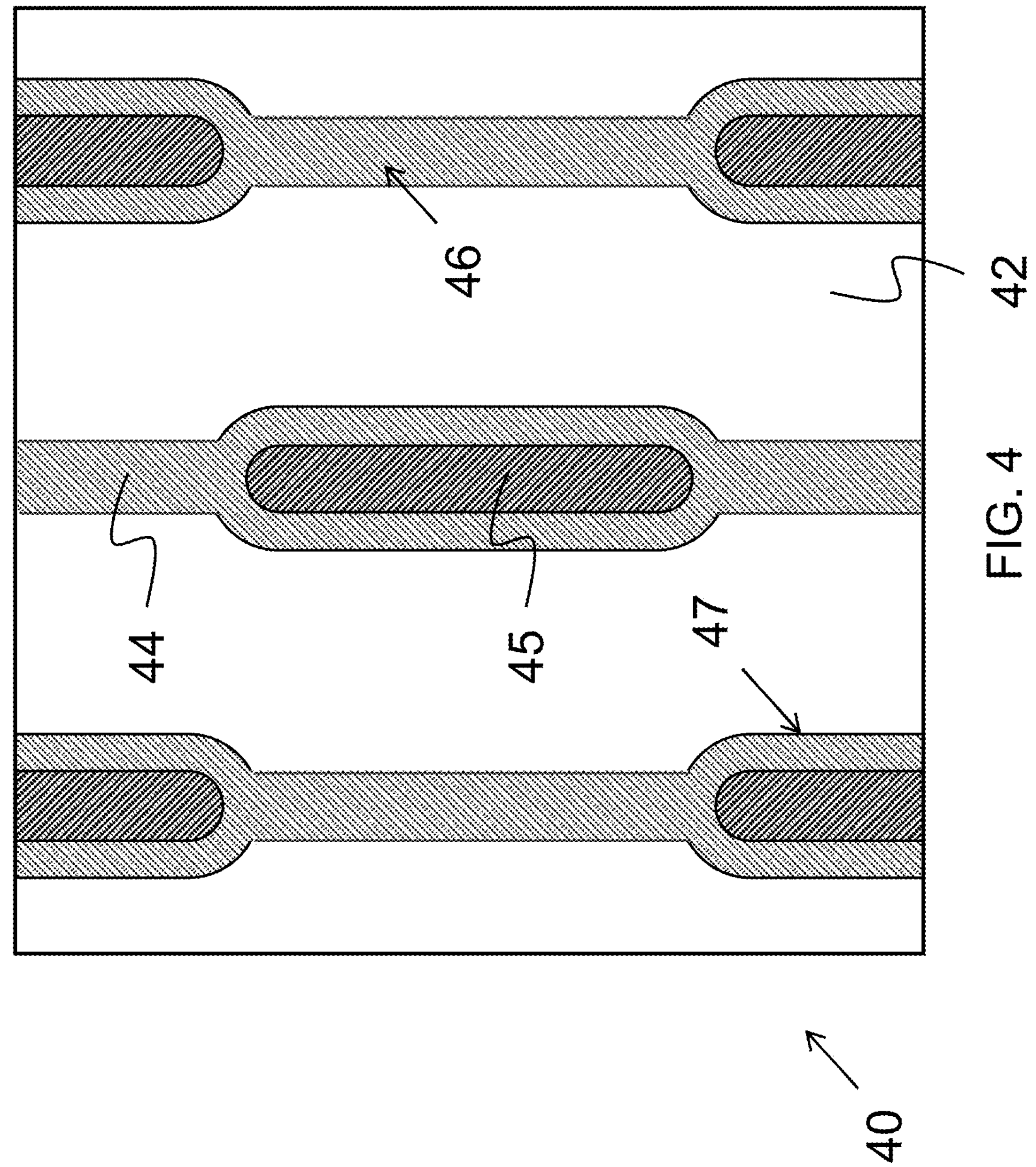
FIG. 4 schematically represents a top plan view of a fourth embodiment of the vertical semiconductor component according to the present disclosure.

FIG. 4 schematically represents a top plan view of a fourth embodiment 40 of the vertical semiconductor component according to the present disclosure. As with FIG. 3, this fourth embodiment 40 may correspond to the first embodiment 10 shown in FIG. 1, or to the second embodiment 20 shown in FIG. 2, or may be a different embodiment from those two. This fourth embodiment 40 is similar to the third embodiment 30 of FIG. 3, except in that the layout of the plurality of first regions 44 and the plurality of second regions 45 differs. In particular, the plurality of first regions 44 comprises elongated sections 46, forming a narrower part of a first region, and eye-shaped sections 47, forming a wider part of a first region. As shown, these elongated and eye-shaped sections 46, 47 may alternate over the extension length of an individual first region 44. The second regions 45 are embedded in the first regions 44, at the eye-shaped sections 47. In this manner, the second regions 45 may be better distributed over the active area of the semiconductor component, whilst ensuring that the first regions 44 still extend over a large area. Note that the plurality of second regions 45 may thus be embedded in at most a partial section of the plurality of first regions 44. Note also that the elongated sections 46 of the first regions 44 may connect two sequential second regions 45, as is for instance visible at the left and at the right parts of the figure.

FIG. 5 schematically represents a top plan view of a first additional example 50 of the vertical semiconductor component. As with FIG. 3, this first additional example 50 may correspond to the first embodiment 10 shown in FIG. 1, or to the second embodiment 20 shown in FIG. 2, or may be a different embodiment from those two. This first additional example 50 is similar to the fourth embodiment 40 of FIG. 4, except in that the layout of the plurality of first regions 54 differs. Instead of elongated sections connecting sequential second regions 55, transverse or lateral sections 58 of a first region 54 are used. These lateral sections 58 connect neighboring parts of first regions 54.

Figure 6:
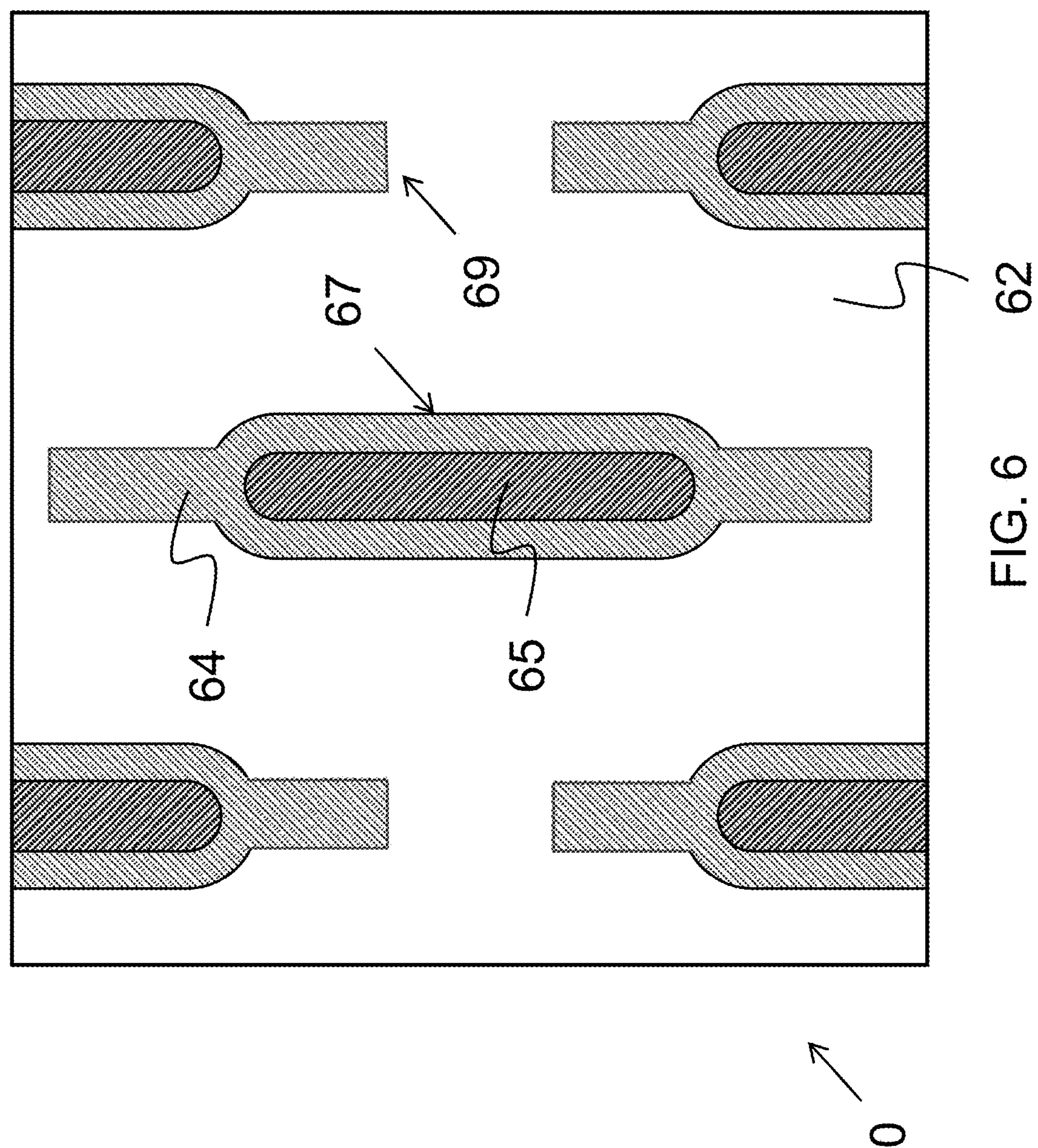
FIG. 6 schematically represents a top plan view of a sixth embodiment of the vertical semiconductor component according to the present disclosure.

FIG. 6 schematically represents a top plan view of a sixth embodiment 60 of the vertical semiconductor component according to the present disclosure. As with FIG. 3, this sixth embodiment 60 may correspond to the first embodiment 10 shown in FIG. 1, or to the second embodiment 20 shown in FIG. 2, or may be a different embodiment from those two. This sixth embodiment 60 is similar to the fourth embodiment 40 of FIG. 4, except in that the layout of the first regions 54 differs. The elongated sections of the first regions 64 comprise interruptions 69, such that each separate first region 64 has one corresponding second region 65 embedded therein, in an eye-shaped section 67 of that first region 64. Note that the plurality of second regions 65 may thus be embedded in at most a partial section of the plurality of first regions 64.

FIG. 7 schematically represents a top plan view of a second additional example 70 of the vertical semiconductor component. As with FIG. 3, this second additional example 70 may correspond to the first embodiment 10 shown in FIG. 1, or to the second embodiment 20 shown in FIG. 2, or may be a different embodiment from those two. This second additional example 70 is similar to the above-described embodiments, except in that the layout of the plurality of first regions 74 and of the plurality of second regions 75 differs. The first regions 74 are laid out in a repeating hexagonal pattern (only tops and bottoms of the pattern are shown). The first regions 74 comprise an integral strip of material deposited in a serpentine pattern. The second regions 75 are embedded in circular nodes of the hexagonal pattern. Note that the plurality of second regions 75 may thus be embedded in at most a partial section of the plurality of first regions 74. The figure also shows that the shape of the second regions 75 may be circular, but of course any suitable shape of second region may be used with any embodiment of the vertical semiconductor component according to the present disclosure.

Of course, the skilled person will appreciate that the particular layouts illustrated in the above figures are merely some of the many available options and that variations to these layouts may be used instead.

FIGS. 8-11 schematically represent graphs showing an exemplary operation of an embodiment of the vertical semiconductor component according to the present disclosure. The improvement was verified experimentally for an exemplary embodiment according to the present disclosure, in particular the embodiment 40 of FIG. 4 mentioned above. Here a comparison is made between an MPS diode, an MPS diode with blinded cells (i.e. areas filled with large p-type regions) and the exemplary embodiment according to the present disclosure.

Figure 8:
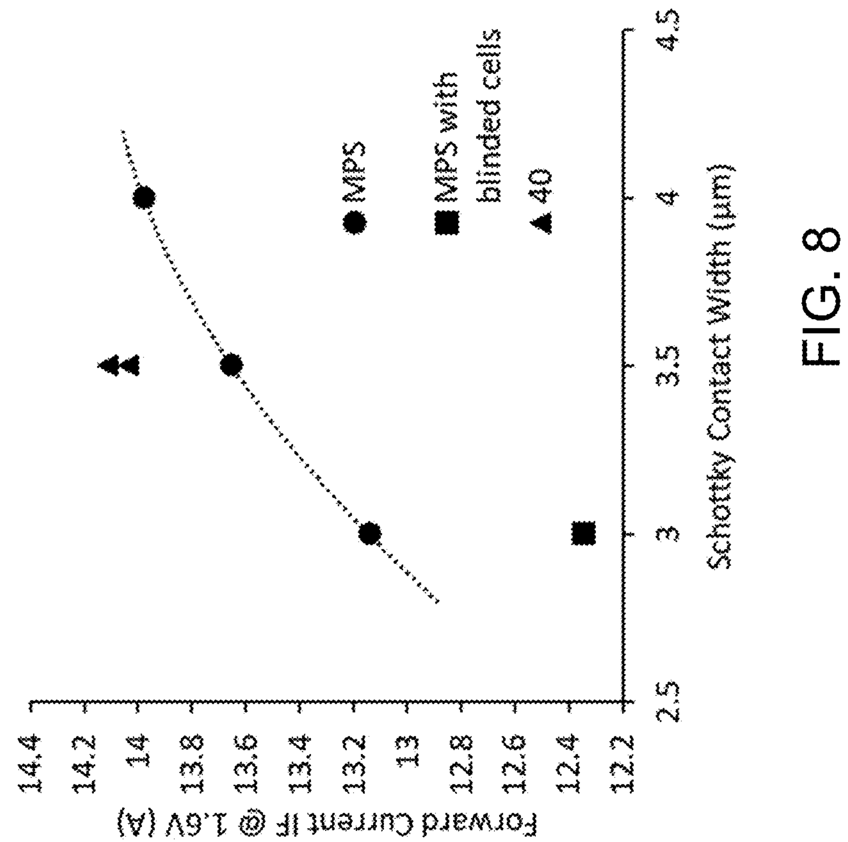
FIGS. 8, 9, 10, 11 and 12 schematically represent graphs showing an exemplary operation of an embodiment of the vertical semiconductor component according to the present disclosure.

FIG. 8 shows the forward current in the rectifier when applying 1.6V forward bias voltage. Clearly the exemplary embodiment according to the present disclosure can carry more current for the same forward bias, which is caused by the increased fraction of the Schottky area.

Figure 9:
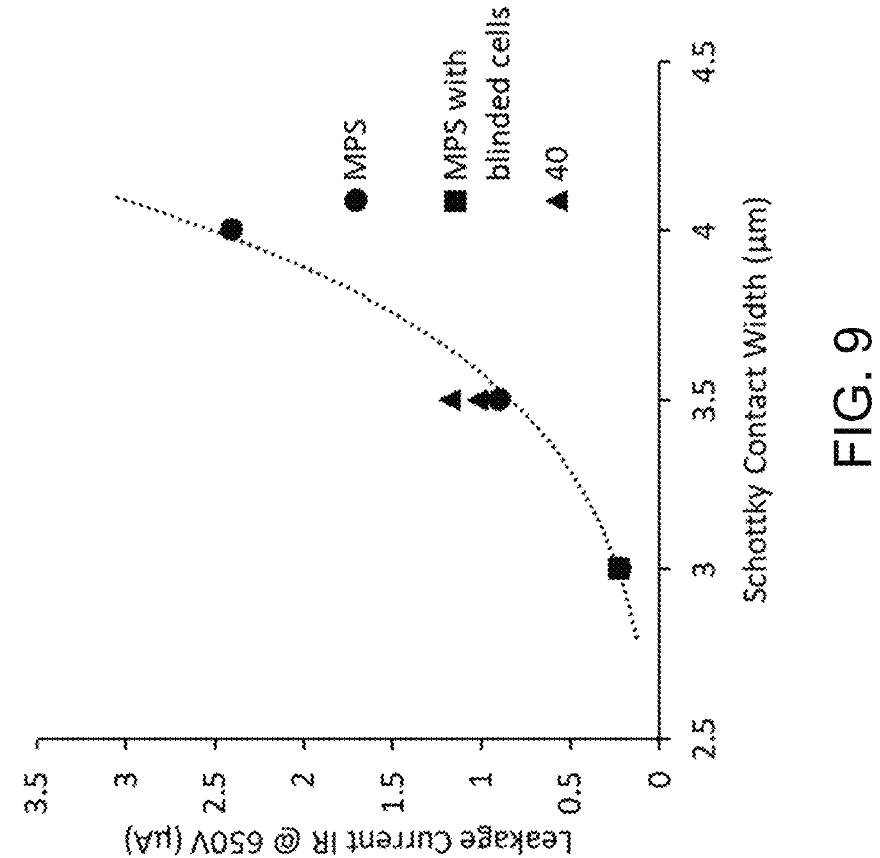

Another option in the above case to achieve the same forward current performance would be to increase of the Schottky contact width to 4 μm. However, this is accompanied by a significant increase in leakage current, which is not observed for the exemplary embodiment according to the present disclosure as seen in FIG. 9.

The exemplary embodiment according to the present disclosure shows a leakage performance comparable to MPS structures with the same Schottky contact width, i.e. there is no leakage drawback due to this die design.

Figure 10:
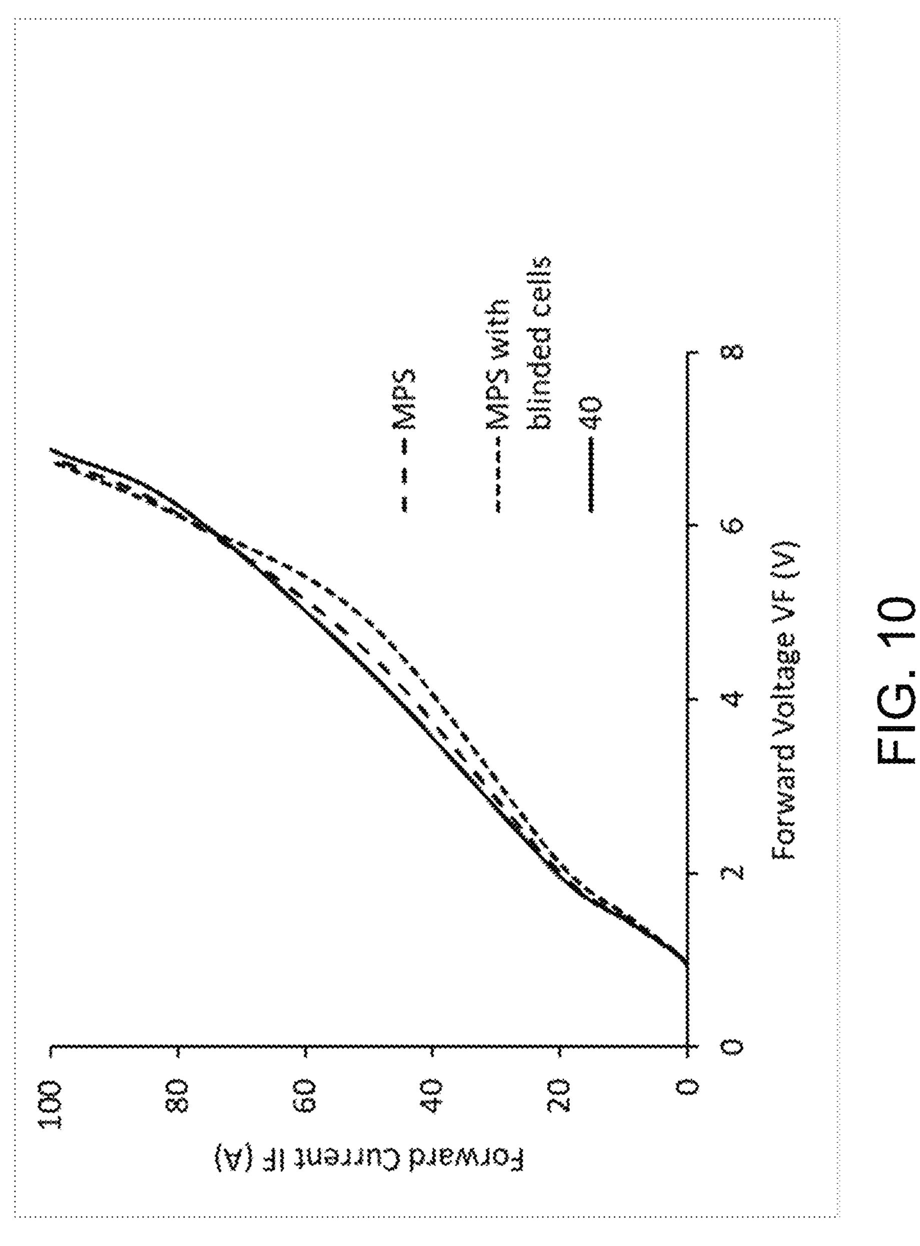

One finds some difference in the very high current regime, due to the different onset of minority carrier injection. This is seen in the “knee” voltage when plotting the forward current as a function of voltage. It amounts to 5V for the MPS diodes, and 6V for the exemplary embodiment according to the present disclosure as seen in FIG. 10.

Figure 11:
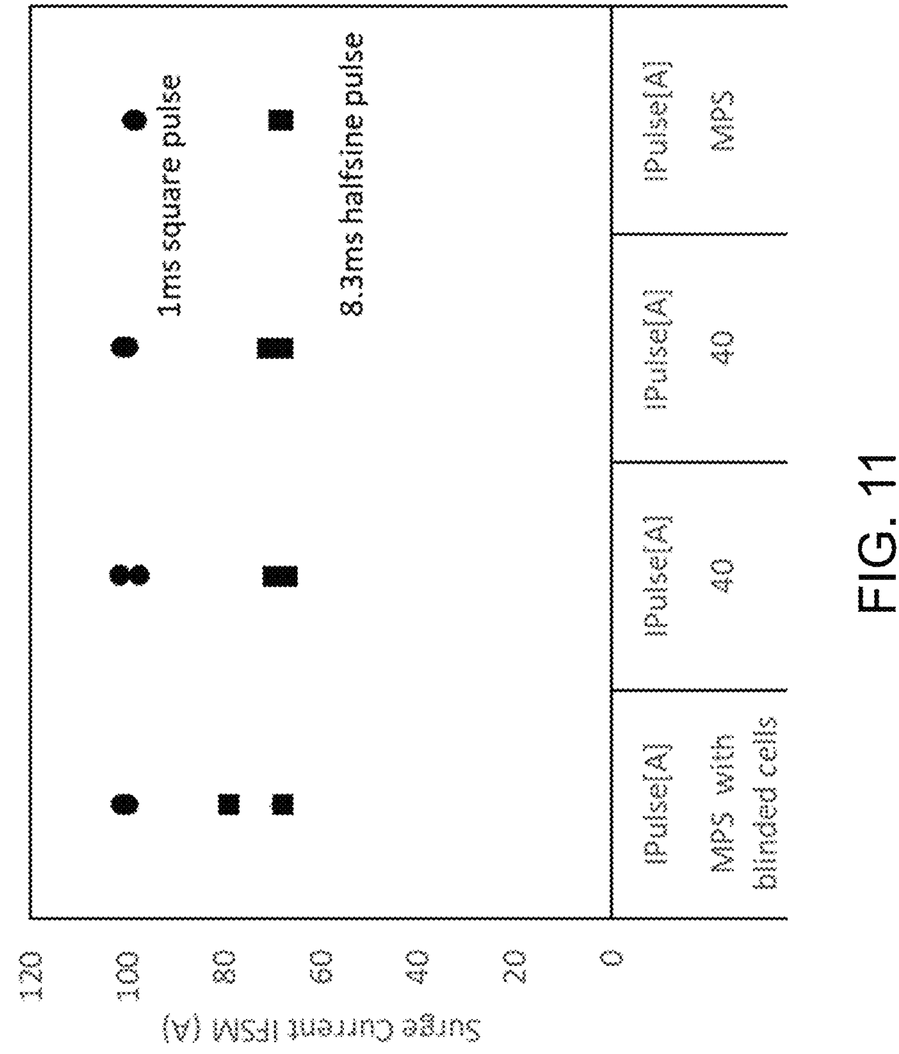

Other forward parameters are not appreciably affected, in particular to mention the surge current capability at long pulse width (8.3 ms) and at short pulse length (1 ms). In the former case the device operates mainly in Schottky mode, whilst in the latter case the charge carrier modulation due to minority carrier is needed. The respective data is seen in FIG. 11.

Figure 12:
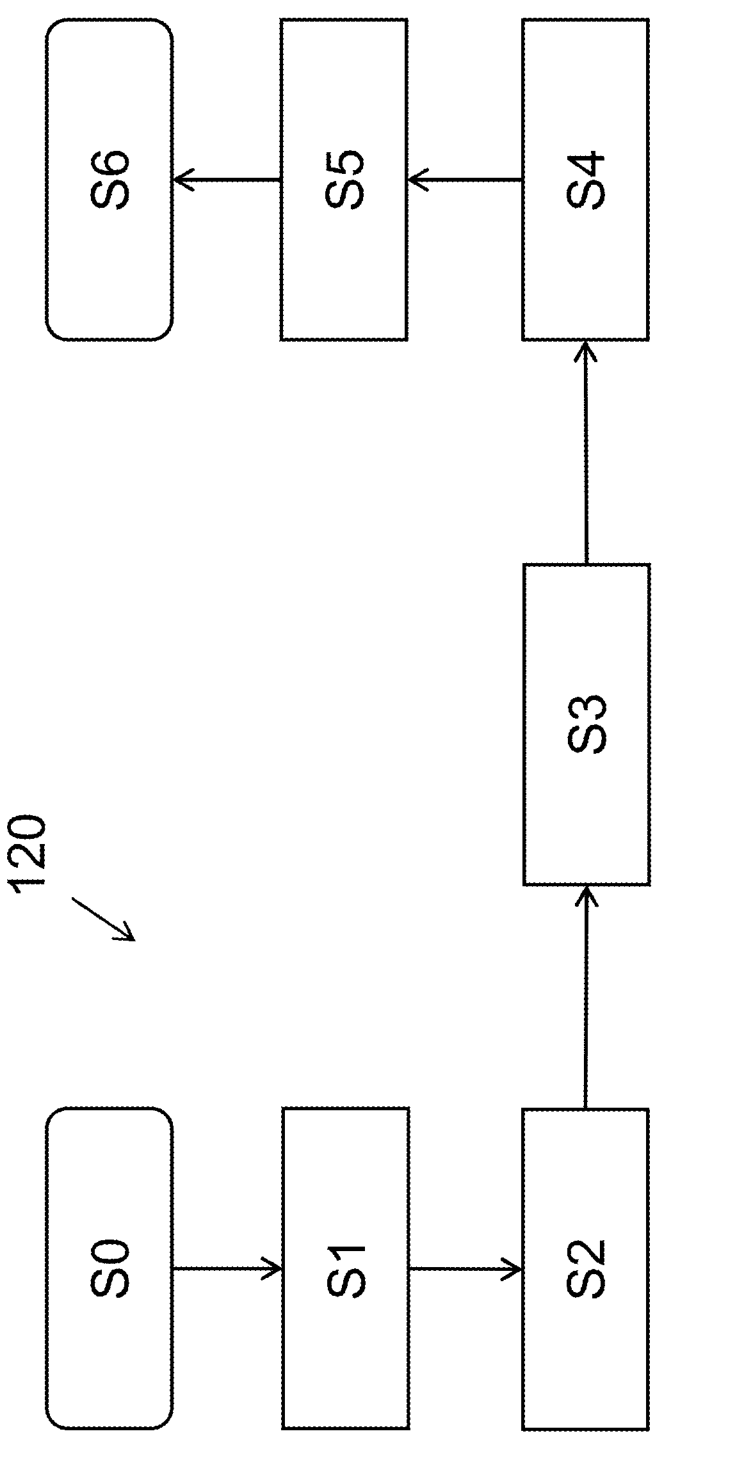

FIG. 12 schematically represents an exemplary embodiment 120 of a method of manufacturing a vertical semiconductor component, according to the present disclosure. The method 120 starts at S0 and stops at S6. The method comprises the following steps:

Step S1 is providing a substrate.

Step S2 is providing an epitaxial layer doped with a first conductivity type, preferably n-doped, on the substrate.

Step S3 is embedding a plurality of first regions in the epitaxial layer, the plurality of first regions arranged to contact a metal layer on the epitaxial layer (the metal layer to be deposited in step S5), the plurality of first regions doped with a second conductivity type, preferably p-doped, at a first concentration, in order to form a plurality of pn-junctions with the epitaxial layer.

Step S4 is embedding each of a plurality of second regions in a first region of the plurality of first regions, the plurality of second regions arranged to contact the metal layer, the plurality of second regions doped with a second conductivity type, preferably p-doped, at a second concentration higher than the first concentration, in order to form a plurality of low-resistance ohmic contacts with the metal layer.

Step S5 is depositing the metal layer on the epitaxial layer to form a Schottky contact with the epitaxial layer and to form low-resistance ohmic contacts with the first and the second regions.

Steps S1-S5 are performed in such a manner that the semiconductor component comprises a cross section in a lateral direction of the vertical semiconductor component, along which cross section the number of first regions of the plurality of first regions is greater than the number of second regions of the plurality of second regions.

In step S5, the metal layer is deposited such that it contacts the epitaxial layer, the first regions and the second regions.

LIST OF ELEMENTS IN THE DRAWINGS

- 10, 20, 30, 40, 50, 60, 70: exemplary embodiments of the vertical semiconductor component according to the present disclosure.
- 11, 21: substrate.
- 12, 22, 32, 42, 52, 62, 72: epitaxial layer.
- 13, 23: metal layer.
- 14A, 14B, 24A, 24B, 34A, 34B, 44, 54, 64, 74: first regions.
- 15, 25, 35, 45, 55, 65, 75: second regions.
- 26: second type of metal of the metal layer.
- 46: elongated section of a first region.
- 47, 67: eye-shaped section of a first region.
- 58: lateral section of a first region.
- 69: interruption of a first region.
- 120: exemplary embodiment of a method according to the present disclosure.
- S0: start of operation of the exemplary embodiment of the method according to the present disclosure.
- S1: providing a substrate.
- S2: providing an epitaxial layer.
- S3: embedding first regions.
- S4: embedding second regions.

S5: depositing a metal layer.

S6: stop of operation of the exemplary embodiment of the method according to the present disclosure.

What is claimed is:

1. A vertical semiconductor component, operable as an MPS diode, the semiconductor component comprising:

a substrate;

an epitaxial layer doped with a first conductivity type that is n-doped and provided on the substrate;

a metal layer deposited on the epitaxial layer to form a Schottky contact with the epitaxial layer;

a plurality of first regions embedded in the epitaxial layer and contacting the metal layer, the plurality of first regions doped with a second conductivity type that is p-doped, at a first concentration, in order to form a plurality of pn-junctions with the epitaxial layer;

a plurality of second regions, each second region embedded in a first region of the plurality of first regions and contacting the metal layer, the plurality of second regions doped with a second conductivity type, that is p-doped, at a second concentration higher than the first concentration, in order to form a plurality of low-resistance ohmic contacts with the metal layer;

wherein the semiconductor component comprises a cross section in a lateral direction of the vertical semiconductor component, and along the cross section a number of first regions of the plurality of first regions is greater than a number of second regions of the plurality of second regions; and wherein the plurality of first regions comprises elongated sections that form a narrower part of a first region, and eye-shaped sections that form a wider part of a first region, and wherein the elongated sections of the first regions comprise interruptions, so that each separate first region has one corresponding second region embedded therein in an eye-shaped section of the first region.

2. The semiconductor component according to claim 1, wherein the plurality of second regions are embedded in at most a subset of the plurality of first regions.

3. The semiconductor component according to claim 1, wherein at least two second regions of the plurality of second regions are connected via a section of a first region of the plurality of first regions.

4. The semiconductor component according to claim 1, wherein neighboring pairs of second regions of the plurality of second regions are at a greater distance from each other than a distance between neighboring pairs of first regions of the plurality of first regions.

5. The semiconductor component according to claim 1, wherein neighboring pairs of second regions of the plurality of second regions are in the range of 1.5 to 2.5 times a distance from each other compared to a distance between neighboring pairs of first regions of the plurality of first regions.

6. The semiconductor component according to claim 1, wherein the metal layer comprises a first type of metal contacting the epitaxial layer and the first regions and a second type of metal contacting the second regions and the first regions.

7. The semiconductor component according to claim 1, wherein the plurality of second regions are embedded in at most a partial section of the plurality of first regions.

8. The semiconductor component according to claim 1, wherein the plurality of first regions, the plurality of second regions or both the plurality of first regions and the plurality of second regions are arranged in a grid formation.

9. The semiconductor component according to claim 1, wherein neighboring pairs of first regions of the plurality of first regions are at regular distances from each other and neighboring pairs of second regions of the plurality of second regions are at regular distances from each other.

10. The semiconductor component according to claim 1, wherein the substrate and the metal layer have plate shapes.

11. The semiconductor component according to claim 1, wherein at least one first region of the plurality of first regions and/or at least one second region of the plurality of second regions comprises an integral strip of material deposited in a serpentine pattern.

12. The semiconductor component according to claim 2, wherein the plurality of second regions are embedded in at most a subset of the plurality of first regions.

13. The semiconductor component according to claim 2, wherein at least two second regions of the plurality of second regions are connected via a section of a first region of the plurality of first regions.

14. The semiconductor component according to claim 2, wherein neighboring pairs of second regions of the plurality of second regions are at a greater distance from each other than a distance between neighboring pairs of first regions of the plurality of first regions.

15. A mask layout for producing a vertical semiconductor component according to claim 1.

16. The vertical semiconductor component according to claim 1, used as a rectifier.

17. A method of manufacturing a vertical semiconductor component operable as an MPS diode, the method comprising:

providing a substrate;

providing an epitaxial layer doped with a first conductivity type that is n-doped, on the substrate;

embedding a plurality of first regions in the epitaxial layer, the plurality of first regions arranged to contact a metal layer on the epitaxial layer, the plurality of first regions doped with a second conductivity type that is p-doped, at a first concentration, in order to form a plurality of pn-junctions with the epitaxial layer;

embedding each of a plurality of second regions in a first region of the plurality of first regions, the plurality of second regions arranged to contact the metal layer, the plurality of second regions doped with a second conductivity type that is p-doped, at a second concentration higher than the first concentration, in order to form a plurality of low-resistance ohmic contacts with the metal layer; and depositing the metal layer on the epitaxial layer to form a Schottky contact with the epitaxial layer and to form low-resistance ohmic contacts with the first and the second regions, so that the semiconductor component comprises a cross section in a lateral direction of the vertical semiconductor component, and along the cross section a number of first regions of the plurality of first regions is greater than a number of second regions of the plurality of second regions; and wherein the plurality of first regions comprises elongated sections that form a narrower part of a first region, and eye-shaped sections that form a wider part of a first region, and wherein the elongated sections of the first regions comprise interruptions, so that each separate first region has one corresponding second region embedded therein, in an eye-shaped section of that first region.

18. The method of claim 17, wherein the metal layer comprises a first type of metal contacting the epitaxial layer and the first regions and a second type of metal contacting the second regions and the first regions.

* * * * *